United States Patent
Akbarpour et al.

(10) Patent No.: US 8,527,923 B1
(45) Date of Patent: Sep. 3, 2013

(54) SYSTEM, METHOD, AND COMPUTER PROGRAM PRODUCT FOR HIERARCHICAL FORMAL HARDWARE VERIFICATION OF FLOATING-POINT DIVISION AND/OR SQUARE ROOT ALGORITHMIC DESIGNS USING AUTOMATIC SEQUENTIAL EQUIVALENCE CHECKING

(75) Inventors: Behzad Akbarpour, Santa Clara, CA (US); Prosenjit Chatterjee, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/423,097

(22) Filed: Mar. 16, 2012

(51) Int. Cl.
*G06F 17/50* (2006.01)
*G06F 9/455* (2006.01)

(52) U.S. Cl.
USPC ........................................ 716/107; 716/106

(58) Field of Classification Search
USPC .................................. 716/106, 107
See application file for complete search history.

(56) References Cited

U.S. PATENT DOCUMENTS

| | | | | |
|---|---|---|---|---|
| 6,668,362 | B1 * | 12/2003 | McIlwain et al. | 716/107 |
| 2008/0183791 | A1 * | 7/2008 | Ho et al. | 708/501 |
| 2009/0216825 | A1 * | 8/2009 | Weinberg et al. | 708/650 |
| 2011/0307848 | A1 * | 12/2011 | Yeung et al. | 716/103 |
| 2012/0198398 | A1 * | 8/2012 | Mahar et al. | 716/102 |
| 2012/0272197 | A1 * | 10/2012 | Baumgartner et al. | 716/107 |

* cited by examiner

*Primary Examiner* — Stacy Whitmore
*Assistant Examiner* — Magid Dimyan
(74) *Attorney, Agent, or Firm* — Zilka-Kotab, PC

(57) ABSTRACT

A system, method, and computer program product are provided for hierarchical formal hardware verification of floating-point division and/or square root algorithmic designs using automatic sequential equivalence checking. In use, for at least one of a floating-point division algorithm and a square root algorithm, an architectural specification for hardware, a hardware implementation on the hardware, and at least one intermediate model having a level of specificity between the architectural specification and the hardware implementation are identified. Additionally, an equivalence is automatically determined, hierarchically, between the architectural specification, and the at least one intermediate model, and between the at least one intermediate model and the hardware implementation. Furthermore, for the hardware, the at least one of the floating-point division algorithm and the square root algorithm are formally verified, based on the automatic sequential equivalence determination.

19 Claims, 4 Drawing Sheets

SYSTEM, METHOD, AND COMPUTER PROGRAM PRODUCT FOR HIERARCHICAL FORMAL HARDWARE VERIFICATION OF FLOATING-POINT DIVISION AND/OR SQUARE ROOT ALGORITHMIC DESIGNS USING AUTOMATIC SEQUENTIAL EQUIVALENCE CHECKING

FIELD OF THE INVENTION

The present invention relates to formal hardware verification, and more particularly to formal hardware verification with respect to floating-point division and/or square root algorithmic designs.

BACKGROUND

Traditionally, simulation has been used to verify that an original architectural specification has been properly implemented in hardware. However, these techniques have not been able to detect all the errors in the design. As a consequence, if a faulty designed chip has been already fabricated, and delivered to customers, a costly replacement may become necessary in addition to the fabrication expenses. Thus, formal hardware verification has generally been used as a complement to traditional simulation techniques to attempt to ensure that the manufactured hardware will function properly (e.g. as designed).

This formal hardware verification has typically involved either interactive theorem proving, and/or model checking, and/or automatic sequential equivalence checking between the architectural specification and the hardware implementation (i.e. to verify that they are functionally equivalent). For example, due to the large abstraction gap between the architectural specification and the hardware implementation, formal hardware verification of floating-point division and/or square root algorithmic designs (M. D. Ercegovac, 2004) has usually involved interactive theorem proving. Unfortunately, these theorem proving techniques used to perform the aforementioned formal hardware verification have exhibited various limitations. Just by way of example, the verification process through interactive theorem proving has been very time consuming, and required high expertise, and at least some, if not all, manual processing by a user.

There is thus a need for addressing these and/or other issues associated with the prior art. For example, Kaivola (R. Kaivola, 2002) presented the formal hardware verification of the floating-point division and square root units of the Intel IA-32 Pentium 4 microprocessor, using the Forte verification framework (C.-J. H, Seger, 2005), using a combination of model checking and theorem proving in higher-order logic (HOL) (M. J. C. Gordon, 1993). As another example, Russinoff (Russinoff, 1998) presented the formal hardware verification of the floating-point division and square root units of the AMD-K7 microprocessor using ACL2 theorem proving tool (M, Kauffmann, 1996).

SUMMARY

A system, method, and computer program product are provided for hierarchical formal hardware verification of floating-point division and/or square root algorithmic designs using automatic sequential equivalence checking, in use, for at least one of a floating-point division algorithm and a square root algorithm, an architectural specification for hardware, a hardware implementation on the hardware, and at least one intermediate model having a level of specificity between the architectural specification and the hardware implementation are identified. Additionally, an equivalence is automatically determined, hierarchically, between the architectural specification, and the at least one intermediate model, and between the at least one intermediate model and the hardware implementation, to prove in effect that the original architectural specification and the hardware implementation are equivalent. Multiple intermediate models may be identified to address a significantly higher abstraction gap between the architectural specification and the hardware implementation, in which case, the intermediate models are also proved equivalent in a successive order based on the abstraction hierarchy. Furthermore, for the hardware, the at least one of the floating-point division algorithm and the square root algorithm are formally verified, based on the automatic sequential equivalence determination.

DETAILED DESCRIPTION

Figure 1:
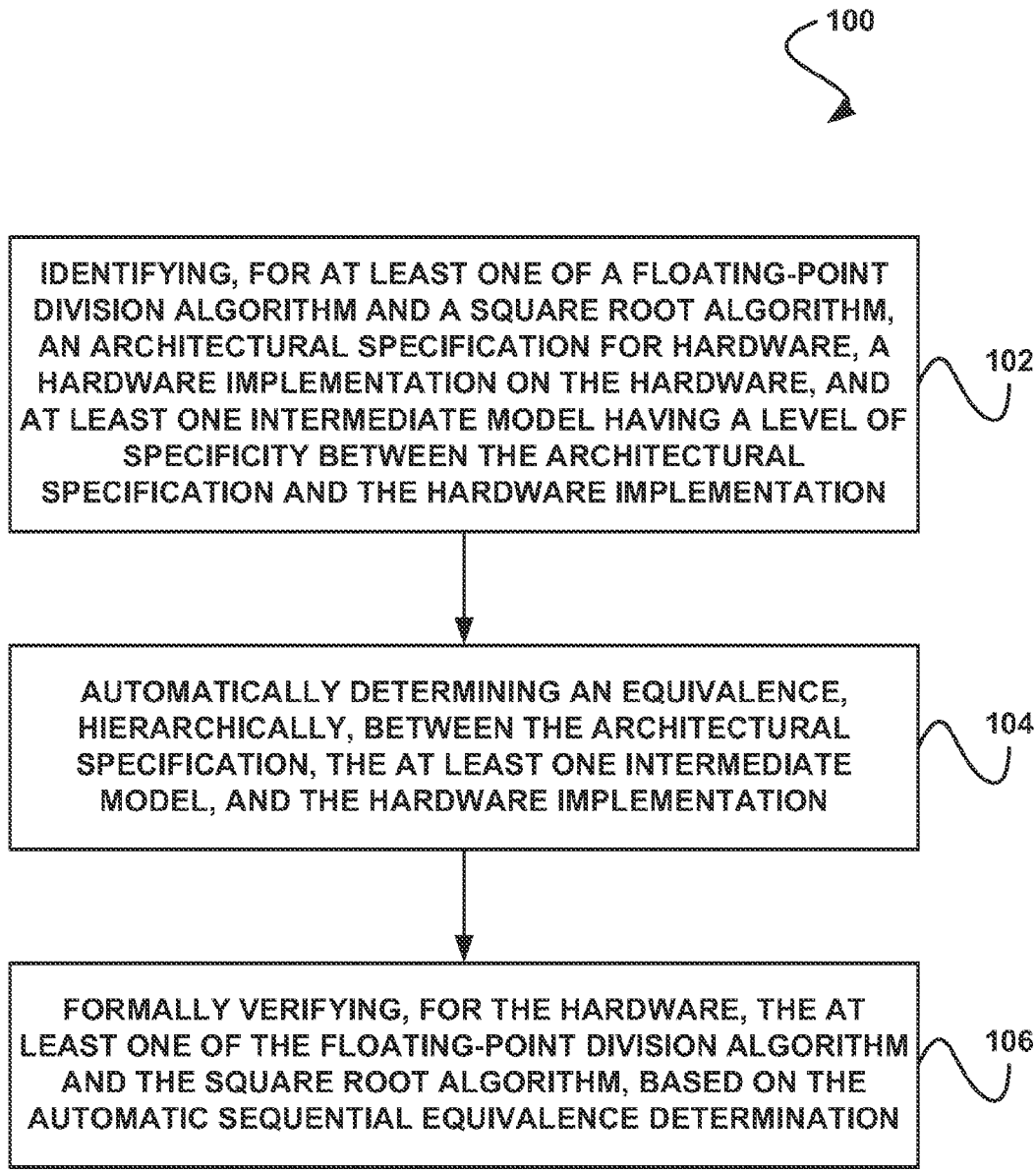
FIG. 1 shows a method for hierarchical formal hardware verification of floating-point division and/or square root algorithmic designs using automatic sequential equivalence checking, in accordance with one embodiment.

FIG. 1 shows a method 100 for hierarchical formal hardware verification of floating-point division and/or square root algorithmic designs using automatic sequential equivalence checking, in accordance with one embodiment. As shown in operation 102, for at least one of a floating-point division algorithm and a square root algorithm, an architectural specification for hardware, a hardware implementation on the hardware, and at least one intermediate model having a level of specificity between the architectural specification and the hardware implementation are identified.

In the present description, the hardware may be any hardware on which a floating-point division algorithm and/or a square root algorithm may be implemented. For example, the hardware may be a processor, such as a central processing unit (CPU).

Additionally, in various embodiments, the floating-point division algorithm may be DIVSS (Scalar Single Precision Divide), DIVPS (Packed Single Precision Divide), DIVSD (Scalar Double Precision Divide), DIVPD (Packed Double Precision Divide), UDIV (Unsigned Integer Divide), SDIV (Signed Integer Divide), etc. In other various embodiments, the square root algorithm may be SQRTSS (Scalar Single Precision Square Root), SQRTPS (Packed Single Precision Square Root), SQRTSD (Scalar Double Precision Square Root), SQRTPD (Packed Double Precision Square Root), etc.

To this end, the method 100 may be implemented with respect to the floating-point division algorithm and/or the square root algorithm.

Furthermore, the architectural specification for the hardware may be any model (e.g. design) of the floating-point division algorithm and/or square root algorithm that is of a level of specificity (e.g. abstraction) that is higher than the aforementioned hardware implementation and intermediate model(s). For example, the architectural specification may be generated for functionally (e.g. programmatically) describing an intention for the functionality of the hardware. In one embodiment, the architectural specification may be a C model. For example, the architectural specification may be written in C++.

The hardware implementation may be a model of the floating-point division algorithm and/or square root algorithm that is of a level of specificity that is lower than the aforementioned architectural specification and intermediate model(s). For example, the hardware implementation may be generated by a hardware designer with respect to the actual physical implementation of the hardware. In one embodiment, the hardware implementation may be a bit level implementation, such as a register-transfer level (RTL) implementation. For example, the hardware implementation may be written in Verilog. Additionally, the hardware may be a sequential circuit, like a finite state machine (FSM), which involves storage elements like flip-flops and/or registers, where the current output may depend not only on the current input but also on previous input values.

The intermediate model(s), as described above, are of a level of specificity between the architectural specification and the hardware implementation. Thus, the intermediate model(s) may be incrementally greater in detail, less abstracted, etc. from the architectural specification to the hardware implementation. As an option, the intermediate model(s) may be C models (e.g. of varying specificity, etc.). As another option, the intermediate model(s) may each use a bitset library.

In one embodiment, only a single intermediate model may be provided. In another embodiment, multiple intermediate models may be provided, where each has a different level of detail. To this end, the architectural specification, the intermediate model(s), and the hardware implementation may be, in such hierarchy, incrementally greater in detail, less abstracted, etc.

Optionally, the varying levels of specificity, abstraction, etc. between the architectural specification, the intermediate model(s), and the hardware implementation may be based on a number of match points between the same. Such match points may be a point of output of the architectural specification, the intermediate model(s), and the hardware implementation, etc. Just by way of example, a number of common match points between the architectural specification and a first one of the intermediate models may be less than a number of match points between the first one of the intermediate models and a next one of the intermediate models, and a number of common match points between the first one of the intermediate models and a next one of the intermediate models may be less than a number of common match points between a last one of the intermediate models and the hardware implementation.

In this way, the intermediate model(s) may have a greater number of match points with the hardware implementation than a number of match points between the architectural specification and the hardware implementation, thus providing an intermediate abstraction between a level of abstraction of the architectural specification and a level of abstraction of the hardware implementation. It should be noted that the architectural specification, the intermediate model(s), and the hardware implementation may be manually created, and identified from a storage device (e.g. memory, file, etc.) storing the same.

Additionally, as shown in operation 104, an equivalence is automatically determined, hierarchically, between the architectural specification, the at least one intermediate model, and the hardware implementation. The equivalence may be any predetermined level of equivalent functionality between, hierarchically, the architectural specification, the at least one intermediate model, and the hardware implementation. In one embodiment, the equivalence may be determined using match points. The match points may be a remainder, a quotient, etc. Just by way of example, a predetermined number of match points that are the same for each model in the pair being subjected to the equivalence determination e.g. architectural specification and first intermediate model, first intermediate model and next intermediate model, last intermediate model and hardware implementation) may be required to have a same output value in order to determine that such pair of models are equivalent.

As noted above, the equivalence is automatically determined. For example, the equivalence may be determined by simulating, using a single set of inputs, the architectural specification, the at least one intermediate model, and the hardware implementation. For example, the automated nature of the equivalence checking may be provided by first simulating each model in a pair being checked using a common set of input values, and determining whether the simulation results in predetermined match points that are common to each model in the pair having a same output, then the predetermined match points are next formally proved to be equivalent using automatic sequential equivalence checking. To this end, an entirety of the equivalence checking may be automated using a computer, processor, etc.

As noted above, the equivalence is automatically determined between the architectural specification, the at least one intermediate model, and the hardware implementation with respect to the hierarchy thereof. In the present embodiment, such hierarchy relates to the hierarchical pairing of the architectural specification, the at least one intermediate model, and the hardware implementation with respect to the ordering of the architectural specification, the at least one intermediate model, and the hardware implementation by level of abstraction. For example, the equivalence is first determined between the architectural specification, the first intermediate model, then the equivalence is next determined between the first intermediate model and a next (i.e. second) intermediate model, then the equivalence is next determined between the previous (i.e. second) intermediate model and a next (i.e. third) intermediate model, and so on, until the equivalence for the last pair in the ordering is determined, namely for the last intermediate model and the hardware implementation.

In this way, the models may be ordered based on their level of abstraction, such that the equivalence may be determined between each successive pair of the ordered models starting from a most abstracted level and ending with a least abstracted level. Of course, it should be noted that if, during the sequential equivalence checking, any of the pairs of models are determined to not be equivalence, equivalence for the subsequent pairs of models may not necessarily be determined, the reasons for which are described in more detail below.

Furthermore, for the hardware, the at least one of the floating-point division algorithm and the square root algorithm are formally verified, based on the automatic sequential equivalence determination, as shown in operation 106. In one embodiment, the architectural specification, the intermediate model(s), and the hardware implementation may be identified in operation 102 for the floating-point division algorithm, such that the floating-point division algorithm may be formally verified for the hardware. In another embodiment, the architectural specification, the intermediate model(s), and the hardware implementation may be identified in operation 102 for the square root algorithm, such that the square root algorithm may be formally verified for the hardware.

As noted above, the floating-point division algorithm and/or square root algorithm are formally verified, based on the automated sequential equivalence checking as performed in operation 106. Optionally, the floating-point division algorithm and/or square root algorithm may be formally verified for the hardware in response to a determination that each pair of models is equivalent. Just by way of example, the floating-point division algorithm and/or square root algorithm may optionally only be formally verified for the hardware in response to a determination that, hierarchically, the architectural specification, the at least one intermediate model, and the hardware implementation are equivalent.

In this way, formal verification of floating-point division and/or square root algorithms in transition from the architectural specification (e.g. high level native instruction set specifications) down to the hardware implementation (e.g. bit level RTL implementations) may be provided using automatic sequential equivalence checking. This therefore allows the fully automated formal verification of floating-point division and square root algorithm designs. As described above, a hierarchical equivalence checking based on intermediate models may be used to bridge the abstraction gap between the hardware implementation and the architectural specification.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
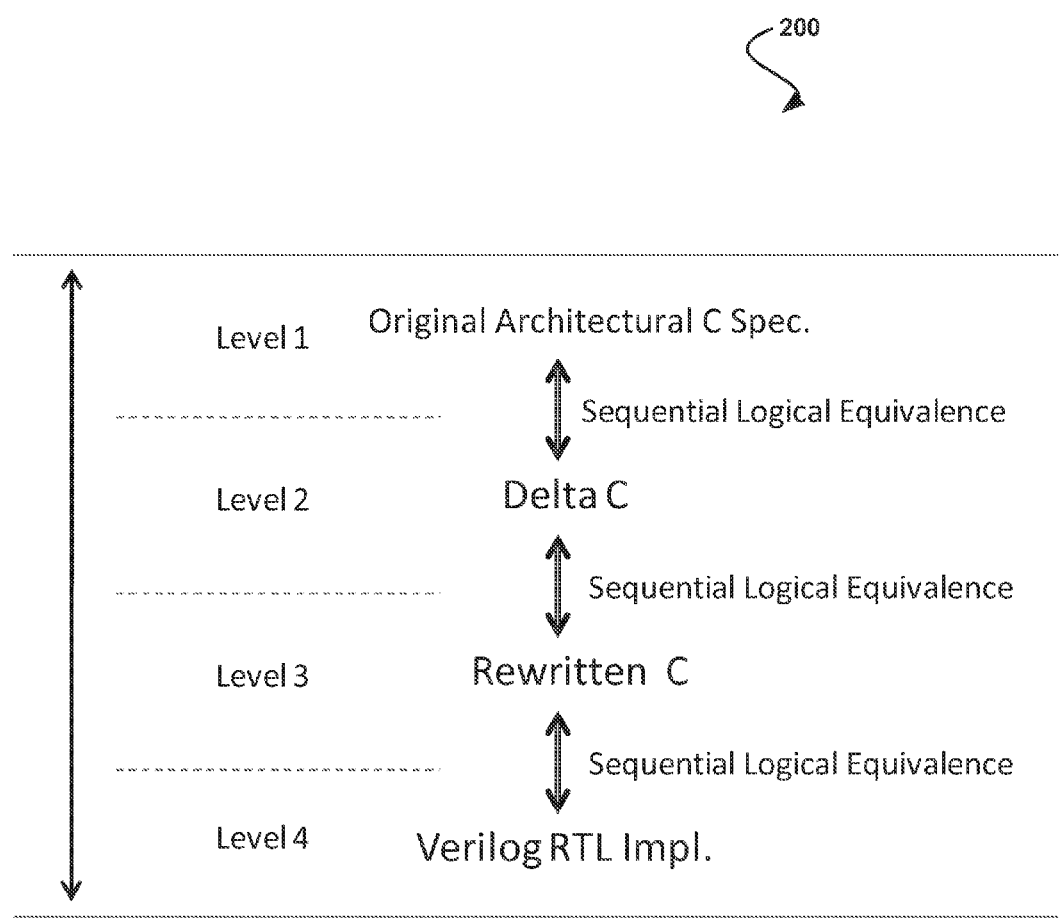
FIG. 2 shows a logical hierarchy of algorithmic designs for use in automatic sequential equivalence checking, in accordance with another embodiment.

FIG. 2 shows a logical hierarchy of algorithmic designs 200 for use in automatic sequential equivalence checking, in accordance with another embodiment. As an option, the designs 200 may be implemented to carry out the method 100 of FIG. 1. Of course, however, the designs 200 may be implemented in any desired environment. It should also be noted that the aforementioned definitions may apply during the present description.

In the present embodiment, there is an abstraction gap between the highest level model and the lowest level model of a floating-point division and/or square root algorithmic design for hardware. Namely, there is an abstraction gap between the original architectural specification (Original Architectural C Spec., as shown) and the hardware implementation (Verilog RTL as shown) of a floating-point division and/or square root algorithmic design for hardware. As shown, a series of intermediate models (Delta C and Rewritten C, as shown) are provided to bridge the abstraction gap. While only two intermediate models are shown, it should be noted that any number of intermediate models may be provided.

For example, the number of intermediate models may be based on a predetermined number of match points required to be common between each successive pair of models that are ordered, as shown, by level of abstraction. In this way, the existing highest level model and the lowest level model may not necessarily have the predetermined number of match points that is required to be common therebetween. The required number of match points may be based on a verification tool (e.g. application, software package, etc.) to be utilized for verifying the floating-point division and/or square root algorithmic design for the hardware. Just by way of example, such verification tool may be Synopsys' Hector, SLEC from Calypto, or any other automated tool used for verifying hardware designs which takes as input various models of the design having varying degrees of abstraction and determines their equivalence (e.g. using match points, etc.).

In one embodiment, the models may be manually generated. For example, starting from the C++ architectural specification model of floating-point division operations, such model may be converted into the Delta-C model which may be a version of the C++ architectural specification that is modified to include the remainder/quotient information for each iteration. Furthermore, a rewritten-C model is coded using C++ bitset library that is closer (in abstraction) to the Verilog RTL implementation.

Figure 3:
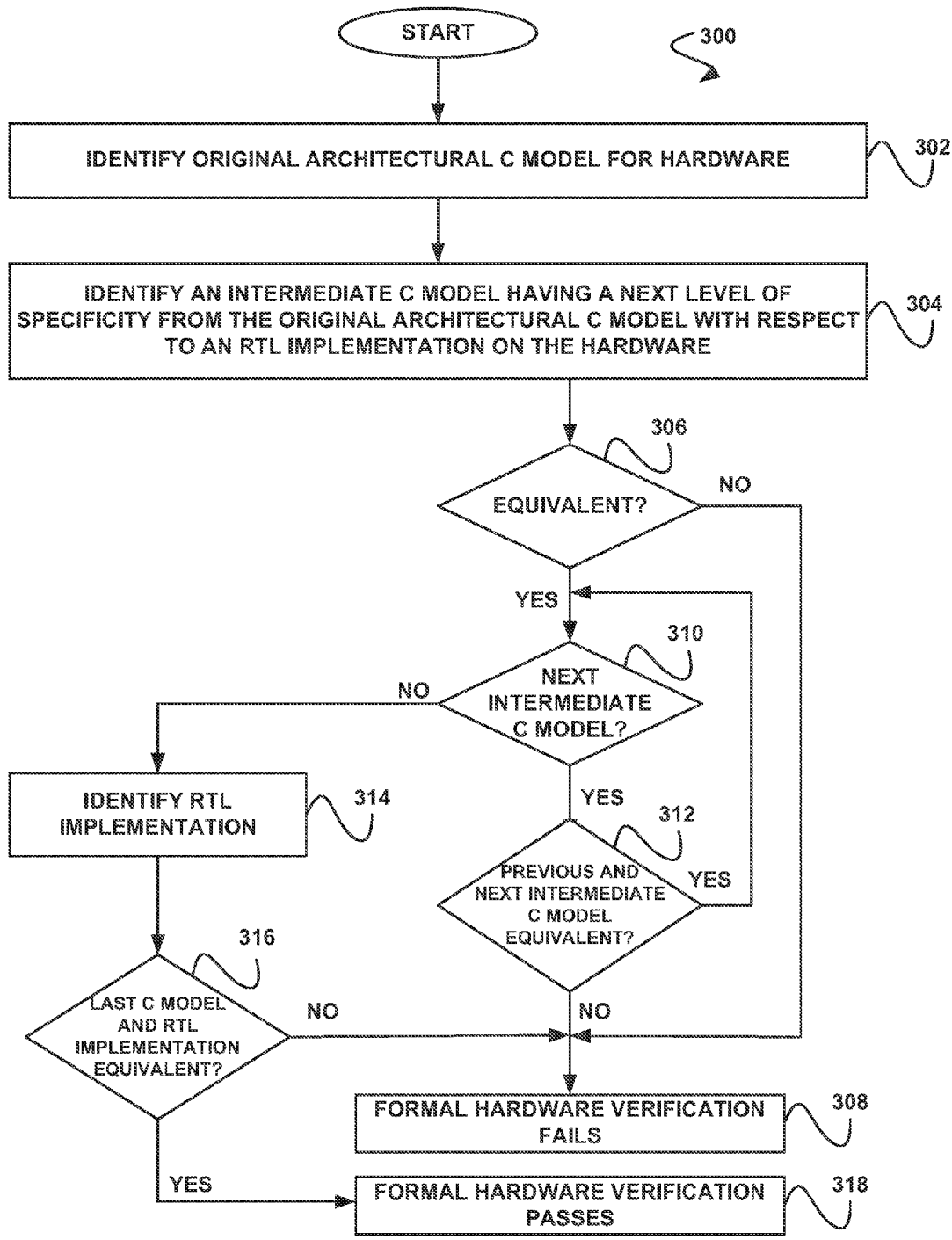
FIG. 3 shows a method for hierarchical formal hardware verification of floating-point division and/or square root algorithmic designs using automatic sequential equivalence checking between an original architectural C model for hardware, an RTL implementation on the hardware, and at least one intermediate C model having a level of specifity between the original architectural C model and the RTL implementation, in accordance with yet another embodiment.

FIG. 3 shows a method 300 for formal hardware verification of floating-point division and/or square root algorithmic designs using automatic sequential equivalence checking between an original architectural C model for hardware, an RTL implementation on the hardware, and at least one intermediate C model having a level of abstraction between the original architectural C model and the RTL implementation, in accordance with yet another embodiment. As an option, the present method 300 may be carried out in the context of the functionality and architecture of FIGS. 1-2. Of course, however, the method 300 may be carried out in any desired environment. It should also be noted that the aforementioned definitions may apply during the present description.

As shown in operation 302, an original architectural C model for hardware is identified. While not shown, in the context of the present embodiment, the method 300 is performed for a floating-point division or square root algorithmic design for the hardware. The original architectural C model may be a high level design of the floating-point division and/or square root algorithmic design for the hardware.

Additionally, an intermediate C model is identified in operation 304, where the intermediate C model has a next level of specificity from the original architectural C model with respect to an RTL implementation on the hardware. Thus, the intermediate C model may have a level of abstraction that is between the original architectural C model and the RTL implementation. Further, in decision 306 it is determined whether the original architectural C model and the intermediate C model are equivalent.

In one embodiment, it may be determined that the original architectural C model and the intermediate C model are equivalent if a predetermined number of match points common to the original architectural C model and the intermediate C model having equivalent output. For example, the original architectural C model and the intermediate C model may each be first simulated using a common set of input, for determining the match points and whether the match points common to the original architectural C model and the intermediate C model having equivalent output, then the predetermined match points are next formally proved to be equivalent using automatic sequential equivalence checking.

If it is determined that the original architectural C model and the intermediate C model are not equivalent, the formal hardware verification fails, as shown in operation 308. For example, failure of the hardware verification may indicate that the floating-point division and/or square root algorithmic design for the hardware has errors, or is otherwise inconsistent, between the RTL implementation and the original architectural C model.

If, however, it is determined that the original architectural C model and the intermediate C model are equivalent, it is determined in decision 310 whether there is a next intermediate C model. In one embodiment, it may be determined whether a file or other storage device storing the models includes another intermediate C model that has a next level of abstraction from the previously identified intermediate C model.

If it is determined that there is a next intermediate C model, it is determined in decision 312 whether the previous intermediate C model and such next intermediate C model are equivalent. In particular, equivalency may be determined for intermediate C models that have successive levels of specificity (e.g. abstraction). This process may be repeated, as shown, for each successive pair of intermediate C models. If any determination of equivalency with respect to a pair of intermediate C models returns a result indicating that such pair is not equivalent, the formal hardware verification fails (operation 308).

However, if all successive pairs of intermediate C models are determined to be equivalent, the RTL, implementation is identified (operation 314), and it is determined whether the last intermediate C model (having a lowest level of abstraction among the intermediate C models) and the RTL implementation are equivalent. Note decision 316.

Once it is determined that the last intermediate C model and the RTL implementation are not equivalent, the formal hardware verification fails (operation 308). However, if it is determined that the intermediate C model and the RTL implementation are equivalent, the formal hardware verification passes, as shown in operation 318. For example, passing of the formal hardware verification may indicate that the floating-point division and/or square root algorithmic design for the hardware does not have errors, or is otherwise consistent, between the RTL implementation and the original architectural C model. In this way, the floating-point division and/or square root algorithmic design may be formally verified for the hardware in response to a determination that the RTL implementation and the last intermediate C model are equivalent.

Figure 4:
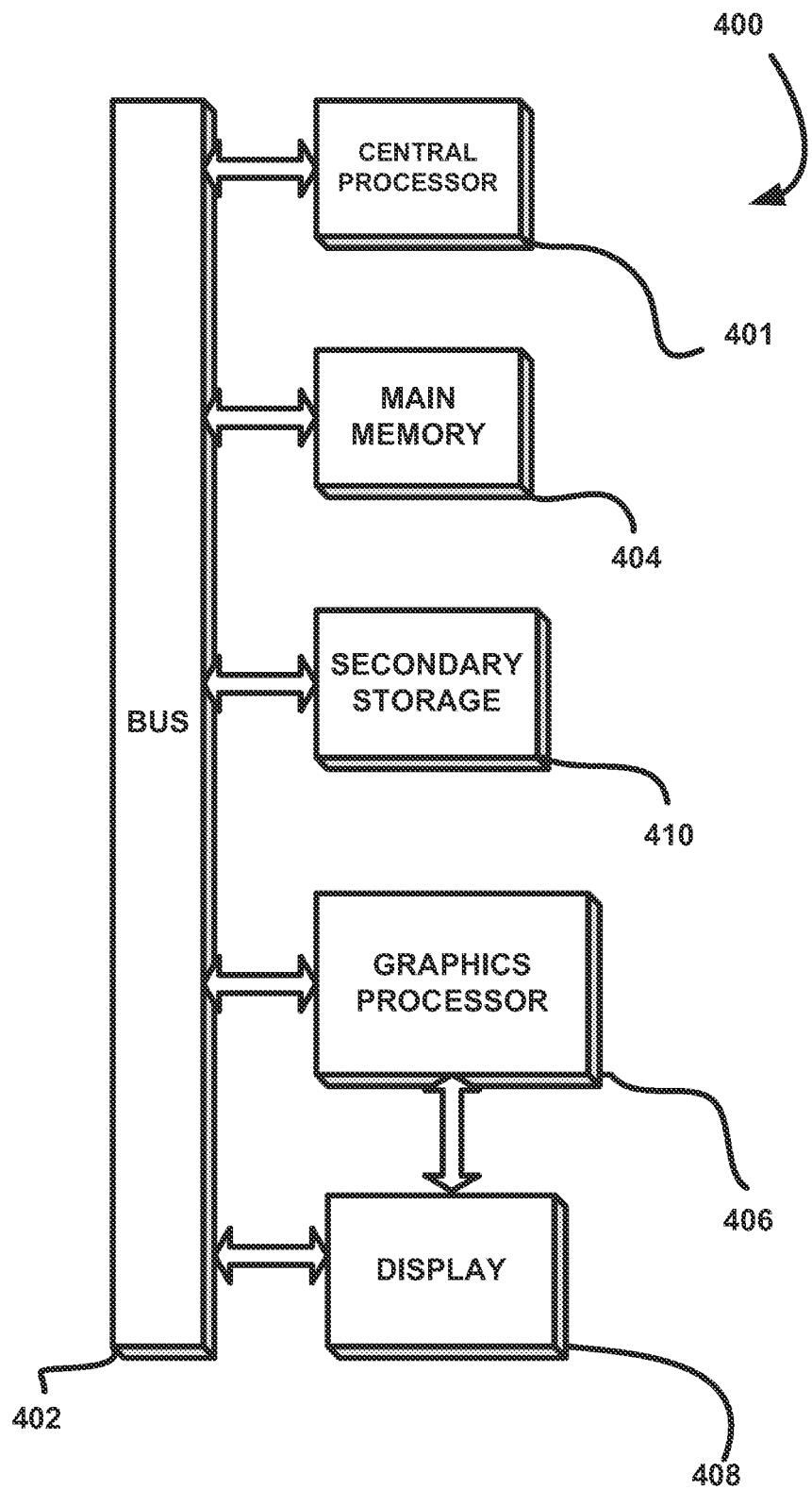
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The system 400 also includes a main memory 404. Control logic (software) and data are stored in the main memory 404 which may take the form of random access memory (RAM).

The system 400 also includes a graphics processor 406 and a display 408, i.e. a computer monitor. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, lap-top computer, and/or any other type of logic. Still yet, the system 400 may take the form of various other devices including, but not limited to a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   identifying a set of algorithmic designs including an architectural specification for a hardware design having a first level of specificity, a hardware implementation having a second level of specificity, and at least one intermediate model having a level of specificity between the first level of specificity and the second level of specificity;
   determining, via an automatic sequential equivalence determination executed by a processor, whether the architectural specification, the at least one intermediate model, and the hardware implementation are equivalent; and
   formally verifying the hardware design based on the automatic sequential equivalence determination,
   wherein the hardware design implements at least one of a floating-point division algorithm and a square root algorithm.

2. The method of claim 1, wherein the floating-point division algorithm is an algorithm selected from the group consisting of a Scalar Single Precision Divide (DIVSS) algorithm, a Packed Single Precision Divide (DIVPS) algorithm, a Scalar Double Precision Divide (DIVSD) algorithm, a Packed Double Precision Divide (DIVPD) algorithm, an Unsigned Integer Divide (UDIV) algorithm, and a Signed Integer Divide (SDIV) algorithm.

3. The method of claim 1, wherein the square root algorithm is an algorithm selected from the group consisting of a Scalar Single Precision Square Root (SQRTSS) algorithm, a Packed Single Precision Square Root (SQRTPS) algorithm, a Scalar Double Precision Square Root (SQRTSD) algorithm, and a Packed Double Precision Square Root (SQRTPD) algorithm.

4. The method of claim 1, wherein the architectural specification is a C model.

5. The method of claim 1, wherein the architectural specification is written in C++.

6. The method of claim 1, wherein the hardware implementation is a bit level implementation.

7. The method of claim 1, wherein the hardware implementation is a register-transfer level (RTL) implementation.

8. The method of claim 1, wherein the at least one intermediate model is a C model.

9. The method of claim 1, wherein the at least one intermediate model uses a bitset library.

10. The method of claim 1, wherein each intermediate model has a level of specificity between the first level of specificity and the second level of specificity.

11. The method of claim 1, wherein the hardware design is a design for a central processing unit.

12. The method of claim 1, wherein determining whether two algorithmic designs are equivalent is performed using predetermined match points.

13. The method of claim 12, wherein the match points include at least one of a remainder and a quotient.

14. The method of claim 1, wherein determining whether two algorithmic designs are equivalent is performed by:
   determining a set of match points for the two algorithmic designs by simulating each of the two algorithmic designs using a single set of inputs and comparing a set of output values from a first algorithmic design of the two algorithmic designs to a set of output values from a second algorithmic design of the two algorithmic designs; and
   proving that the set of match points are equivalent using the automatic sequential equivalence checking.

15. A method, comprising:
   identifying, for at least one of a floating-point division algorithm and a square root algorithm, an architectural specification for hardware, a hardware implementation on the hardware, and at least one intermediate model having a level of specificity between the architectural specification and the hardware implementation;
   automatically determining, via an automatic sequential equivalence determination executed by a processor, an equivalence, hierarchically, between the architectural specification, the at least one intermediate model, and the hardware implementation; and
   formally verifying, for the hardware, the at least one of the floating-point division algorithm and the square root algorithm, based on the automatic sequential equivalence determination,
   wherein automatically determining the equivalence, hierarchically, between the architectural specification, the at least one intermediate model, and the hardware implementation includes:
      a) determining the equivalence between the architectural specification and a first one of the at least one intermediate model having a first level of specificity from the architectural specification;
      b) in response to determining that the architectural specification and the first one of the at least one intermediate model are equivalent, for each subsequent one of the at least one intermediate model having an incrementally greater level of specificity than a previous one of the at least one intermediate model:
         i) determining the equivalence between the subsequent intermediate model and the previous intermediate model;
      c) in response to determining that each subsequent intermediate model is equivalent to the previous intermediate model, determining the equivalence between the hardware implementation and a last one of the intermediate models having a greatest level of specificity from the architectural specification.

16. The method of claim 15, wherein the at least one of the floating-point division algorithm and the square root algorithm are formally verified for the hardware in response to a determination that the hardware implementation and the last one of the intermediate models are equivalent.

17. A computer program product embodied on a non-transitory computer readable medium, comprising:
   computer code for identifying a set of algorithmic designs including an architectural specification for a hardware design having a first level of specificity, a hardware implementation having a second level of specificity, and at least one intermediate model having a level of specificity between the first level of specificity and the second level of specificity;
   computer code for automatically determining, via an automatic sequential equivalence determination executed by a processor, whether the architectural specification, the at least one intermediate model, and the hardware implementation are equivalent; and
   computer code for formally verifying the hardware design based on the automatic sequential equivalence determination,
   wherein the hardware design implements at least one of a floating-point division algorithm and a square root algorithm.

18. An apparatus, comprising:
   a processor for:
      identifying a set of algorithmic designs including an architectural specification for a hardware design having a first level of specificity, a hardware implementation having a second level of specificity, and at least one intermediate model having a level of specificity between the first level of specificity and the second level of specificity;
      automatically determining, via an automatic sequential equivalence determination executed by the processor, whether the architectural specification, the at least one intermediate model, and the hardware implementation are equivalent; and
      formally verifying the hardware design based on the automatic sequential equivalence determination,
   wherein the hardware design implements at least one of a floating-point division algorithm and a square root algorithm.

19. The apparatus of claim 18, wherein the processor remains in communication with a memory and a display via a bus.

* * * * *